(12) United States Patent
Weng et al.

(10) Patent No.: US 11,594,491 B2
(45) Date of Patent: Feb. 28, 2023

(54) MULTI-DIE INTERCONNECT

(71) Applicant: QUALCOMM Incorporated, San Diego, CA (US)

(72) Inventors: Li-Sheng Weng, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/245,903

(22) Filed: Apr. 30, 2021

(65) Prior Publication Data
US 2022/0352075 A1 Nov. 3, 2022

(51) Int. Cl.
| *H01L 23/538* | (2006.01) |
| *H01L 23/13* | (2006.01) |
| *H01L 21/56* | (2006.01) |
| *H01L 21/48* | (2006.01) |
| *H01L 23/31* | (2006.01) |

(52) U.S. Cl.
CPC ...... *H01L 23/5381* (2013.01); *H01L 21/4853* (2013.01); *H01L 21/563* (2013.01); *H01L 23/13* (2013.01); *H01L 23/3157* (2013.01); *H01L 23/5385* (2013.01)

(58) Field of Classification Search
CPC ............. H01L 23/5381; H01L 21/4853; H01L 21/563; H01L 23/3157; H01L 23/5385
USPC ....................................................... 257/776
See application file for complete search history.

(56) References Cited

U.S. PATENT DOCUMENTS

| 9,443,824 | B1 | 9/2016 | We et al. |
| 10,192,810 | B2 | 1/2019 | Karhade et al. |
| 10,276,403 | B2 | 4/2019 | Zhao et al. |
| 10,418,329 | B2 | 9/2019 | Li et al. |
| 2019/0115319 | A1 | 4/2019 | Hiner et al. |
| 2019/0206791 | A1 | 7/2019 | Pietambaram et al. |
| 2020/0098692 | A1* | 3/2020 | Liff ..................... H01L 23/5386 |

OTHER PUBLICATIONS

International Search Report and Written Opinion—PCT/US2022/071738—ISA/EPO—dated Sep. 19, 2022.
Partial International Search Report—PCT/US2022/071738—ISA/EPO—dated Jul. 28, 2022.

* cited by examiner

*Primary Examiner* — Quoc D Hoang
(74) *Attorney, Agent, or Firm* — Muncy, Geissler, Olds & Lowe, P.C.

(57) ABSTRACT

Disclosed is an apparatus including a molded multi-die high density interconnect including: a bridge die having a first plurality of interconnects and second plurality of interconnects. The apparatus also includes a first die having a first plurality of contacts and a second plurality of contacts, where the second plurality of contacts is coupled to the first plurality of interconnects of the bridge die. The apparatus also includes a second die having a first plurality of contacts and a second plurality of contacts, where the second plurality of contacts is coupled to the second plurality of interconnects of the bridge die. The coupled second plurality of contacts and interconnects have a smaller height than the first plurality of contacts of the first die and second die.

24 Claims, 11 Drawing Sheets

MULTI-DIE INTERCONNECT

FIELD OF DISCLOSURE

The present disclosure relates generally to semiconductor devices including multi-die interconnects, package devices, and more specifically, but not exclusively, to multi-die high density interconnects and multi-die high density interconnect package devices and fabrication techniques thereof.

BACKGROUND

Integrated circuit technology has achieved great strides in advancing computing power through miniaturization of active components. The various packaging technologies such as multi-die packages can be found in many electronic devices, including processors, servers, radio frequency (RF) integrated circuits, etc. High density interconnect technology becomes cost-effective in high pin count devices. Advanced packaging and processing techniques including high density interconnects allow for system on a chip (SOC) devices, which may include multiple function blocks, with each function block designed to perform a specific function, such as, for example, a microprocessor function, a graphics processing unit (GPU) function, a communications function (e.g., Wi-Fi, Bluetooth, and other communications), and the like.

Two main technologies have been offered in the industry to enable high density interconnects in package design, (1) Chip-on-Wafer-on-Substrate (CoWoS) and (2) Embedded Multi-die Interconnect Bridge (EMIB). Generally, the CoWoS configuration provides an interposer which allows for a good silicon (Si) to Si bond. However, the use of an interposer and through-silicon-vias increases the fabrication costs and package size. The EMIB configuration provides a limited high density/fine pitch portion but suffers from low yield due to the surface conditions (such as surface undulation) in the fine pitch area.

Accordingly, there is a need for systems, apparatuses and methods that overcome the deficiencies of conventional interconnect designs including the methods, systems and apparatuses provided herein in the following disclosure.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes, an apparatus including a multi-die interconnect. The apparatus also includes a bridge die having a first plurality of interconnects and a second plurality of interconnects. The apparatus also includes a first die having a first plurality of contacts and a second plurality of contacts, where the second plurality of contacts of the first die is coupled to the first plurality of interconnects of the bridge die and where the second plurality of contacts of the first die both have a smaller height than the first plurality of contacts of the first die; and a second die having a first plurality of contacts and a second plurality of contacts, where the second plurality of contacts of the second die is coupled to the second plurality of interconnects of the bridge die and where the second plurality of contacts of the second die both have a smaller height than the first plurality of contacts of the second die.

In accordance with the various aspects disclosed herein, at least one aspect includes a method for fabricating an apparatus having a multi-die interconnect. The method also includes providing a bridge die having a first plurality of interconnects and second plurality of interconnects; providing a bridge die having a first plurality of interconnects and a second plurality of interconnects. The method also includes coupling a first die having a first plurality of contacts and a second plurality of contacts to the first plurality of interconnects of the bridge die using the second plurality of contacts of the first die, where the second plurality of contacts of the first die and first plurality of interconnects have both a smaller height than the first plurality of contacts of the first die. The method also includes coupling a second die having a first plurality of contacts and a second plurality of contacts to the second plurality of interconnects of the bridge die using the second plurality of contacts of the second die, where the second plurality of contacts of the second die and the second plurality of interconnects have both a smaller height than the first plurality of contacts of the second die.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
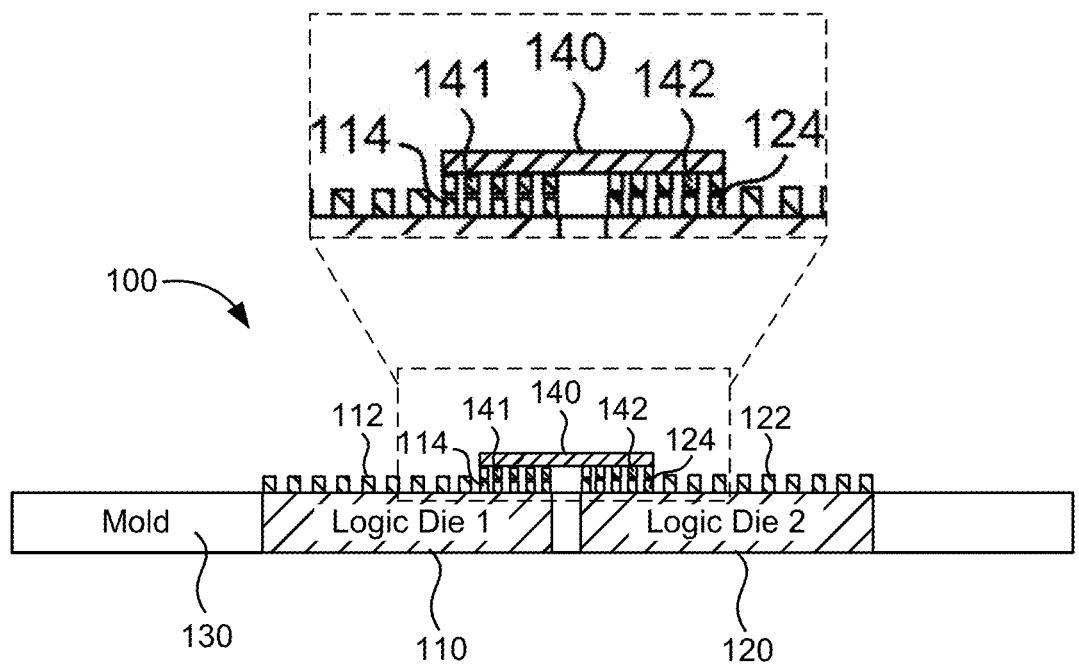
FIG. 1 illustrates a partial cross-sectional view of a multi-die high density interconnect in accordance with at least one aspect of the disclosure.

In accordance with common practice, the features depicted by the drawings may not be drawn to scale.

Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Various aspects disclosed a molding process (e.g., with a re-usable silicon or glass carrier) to accurately secure active/logic dies during the bridge die attach process without significant movement (such as, x axis movement, y axis movement and tilt). This can facilitate a higher yield when attaching a bridge die to multiple dies in a multi-die package. One or more bridge dies can be attached onto the molded and accurately secured multi-die component to facilitate a high-density die-to-die interconnect. In accordance with the various aspects disclosed, the processes/packaging architecture can be utilized to improve the die attach yield when a fine bump pitch (e.g., 55 µm) is being used. The various aspects provide for improved interconnection and securing of dies and reduced misalignment, which improves yield during the fine bump pitch die attach process.

In various aspects disclosed, molded multi-die arrangements are utilized for the bridge die attach procedure to form the molded multi-die high-density interconnect packaging architecture discussed herein. A molded and accurately secured multi-die arrangement facilitates attaching a bridge die with high-density interconnects. However, it will be appreciated that the molding process is merely provided to aid the explanation and the various aspects disclosed and should not be construed to be limited to these values or example application.

In the various aspects disclosed, bridge dies with a fine bump pitch are directly attached to the dies to form the molded multi-die high-density interconnect packaging architecture discussed herein. Bridge dies with a fine bump pitch may be used in various applications, such as high-bandwidth-memory. In some aspects, the fine bump pitch may be in the range of 40 µm to 55 µm. However, it will be appreciated that the example range is merely provided to aid in the explanation and the various aspects disclosed and claimed should not be construed to be limited to these values or example application.

At least some benefits of the proposed packaging architecture include: (1) precise Si to Si bond/attach with minimum misalignment (such as, x-axis y-axis misalignment and tilt) to cause yield loss; (2) a high-density interconnect (bridge) provided to only in the limited area of the bridge; and (3) no through-silicon-via among other benefits as will be appreciated from disclosure provided herein.

FIG. 1 illustrates an apparatus having a molded multi-die high density interconnect 100, according to one or more aspects of the disclosure. In some aspects, the molded multi-die high density interconnect 100 includes a bridge die 140 having a first plurality of interconnects 141 and second plurality of interconnects 142. In some aspects, the plurality of interconnects may be coupled on at least one metallization layer of the bridge die. The at least one metallization layer may include traces according to an application specific routing pattern. The first plurality of interconnects 141 and second plurality of interconnects 142 may be formed from any high conductive material, such as, copper (Cu), aluminum (Al), silver (Ag), gold (Au) or other conductive materials, alloys, or combinations thereof. Alternatively, or in addition, the first plurality of interconnects 141 and second plurality of interconnects 142 may be formed as die bumps, including, for instance, wire stud bumps, plated bumps, and solder bumps.

A first die 110 has a first plurality of contacts 112 and a second plurality of contacts 114. The second plurality of contacts 114 of the first die 110 may have a smaller height than the first plurality of contacts 112. In some aspects, the first plurality of contacts 112 may be copper pillar bumps. In some aspects, the second plurality of contacts 114 may be pads. In other aspects, the first plurality of contacts 112 may be solder bumps, and the second plurality of contacts 114 may be wire stud bumps. The second plurality of contacts 114 is coupled to the first plurality of interconnects 141 of the bridge die 140. It will be appreciated that the various aspects disclosed are not limited to a specific configuration of the first die 110 contacts (112, 114) or bridge die 140.

A second die 120 has a first plurality of contacts 122 and a second plurality of contacts 124. The second plurality of contacts 124 may have a smaller height than the first plurality of contacts 122. In some aspects, the first plurality of contacts 122 may be copper pillar bumps. In some aspects, the second plurality of contacts 124 may be pads. In other aspects, the first plurality of contacts 122 may be solder bumps, and the second plurality of contacts 124 may be wire stud bumps. The second plurality of contacts 124 is coupled to the second plurality of interconnects 142 of the bridge die 140. It will be appreciated that the various aspects disclosed are not limited to a specific configuration of the second die 120 contacts (122, 124) or bridge die 140 interconnects 142.

In some aspects, the first plurality of interconnects 141 of the bridge die 140 has a smaller height than the first plurality of contacts 112 of the first die 110. Also, the first plurality of interconnects 141 of the bridge die 140 has a smaller height than the first plurality of contacts 122 of the second die 120.

In some aspects, the first plurality of contacts 112 of the first die 110 and the first plurality of contacts 122 are of the second 120 die are coupled to a plurality of connectors (not visible) on the outside of the multi-die package 100. In some aspects, the first plurality of contacts 112 and 122 may be coupled to a package substrate to connectors on the outside of the multi-die package 100. In other aspects, the first plurality of contacts 112 and 122 may be coupled to an (intermediate) interposer before coupling to connectors on the outside of the multi-die package 100. In further aspects, the first plurality of contacts 112 and 122 may also be coupled via a passive network (e.g., resistances, capacitances and/or inductances) to connectors on the outside of the multi-die package 100.

The first die 110 and second die 120 are embedded in a mold compound 130 to prevent bridge die 140 misalignment. This is performed prior to the bridge die attachment (see the fabrication process discussion below for details). The first plurality of interconnects 141 and second plurality of interconnects 142 of the bridge die 140 may be configured as die bumps (e.g., small copper pillars with solder pads) with a fine pitch in the range of approximately 40 μm to 55 μm. It will be appreciated that generally the pitch of interconnects (141, 142) of the bridge die 140 and associated (logic) die contacts (114, 124) is finer (i.e., smaller) than the pitch of the contacts (112, 122) not coupled to the bridge die (140).

Figure 2:
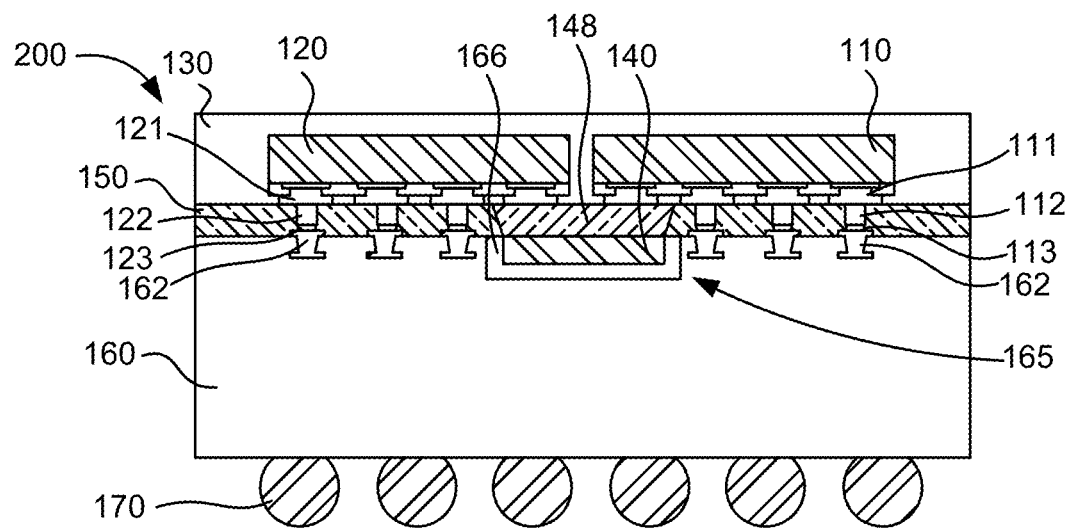
FIG. 2 illustrates a partial image of a multi-die package in accordance with at least one aspect of the disclosure.

FIG. 2 illustrates an apparatus having a molded multi-die high density interconnect package 200, according to one or more aspects of the disclosure. After attachment of the bridge die 140 to first die 110 and the second die 120, the first plurality of interconnects 141 (not visible) and second plurality of interconnects 142 (not visible) of the bridge die 140 may be embedded in a first underfill 148. In some aspects, the first plurality of contacts 112 of the first die 110 are copper pillars, which may have solder bumps 113, and the second plurality of contacts 114 of the first die 110 are bumps with a fine pitch to match the pitch of the bridge die interconnects (also embedded in the first underfill 148). Likewise, the first plurality of contacts 122 of the second die 120 may be copper pillars, which may have solder bumps 123, and the second plurality of contacts 124 of the second die 120 are bumps with a fine pitch to match the pitch of the bridge die interconnects (also embedded in the first underfill 148). As noted above, in alternative aspects, the second plurality of contacts 114 and second plurality of contacts 124 may be pads with a fine pitch to match the pitch of the bridge die interconnects 141, 142.

The package 200 may further include a package substrate 160 having a cavity 165 and a plurality of contact pads 162. The bridge die 140 is embedded in the cavity 165 and may be attached with adhesive 166. The plurality of contact pads 162 is coupled to the first plurality of contacts 112 of the first die 110 and the first plurality of contacts 122 of the second die 120. An optional second underfill 150 may be disposed between the mold compound 130 and the package substrate 160. In some aspects, as illustrated, the second underfill 150 encapsulates at least a portion of the plurality of contact pads 162, the first plurality of contacts 112 of the first die 110, the first plurality of contacts 122 of the second die 120 and the first underfill 148.

It will be appreciated that the multi-die package 200 has a plurality of connectors 170 on the outside of the multi-die package 200 that allow for the package 200 to be coupled to external devices. The plurality of connectors 170 is illustrated as a ball grid array (BGA) having a plurality of solder balls. Further, it will be appreciated that at least some of plurality of contact pads 162 are electrically coupled to some of the connectors 170 (through internal package routing not illustrated for simplicity). Additionally, it will be appreciated that a plurality of contact pads 162 is electrically coupled to both the first die 110 and the second die 120 and through them to the bridge die 140. Specifically, the plurality of contact pads 162 can be coupled to the first plurality of contacts 112 of the first die 110 using the solder pads/bumps 113 and the first plurality of contacts 122 of the second die 120 using the solder pads/bumps 123. The first plurality of contacts 112 of the first die 110 are coupled to pads 111, which in turn may be coupled electrically to conductive layers (e.g., through internal package routing) within the first die 110 and/or through internal package routing within the multi-die package 200 (not illustrated for simplicity), to the bridge die 140. Likewise, the second plurality of contacts 122 of the second die 120 are coupled to pads 121, which in turn may be coupled electrically conductive layers within the second die 120 and/or through internal package routing within the multi-die package 200 (not illustrated for simplicity) to the bridge die 140. Accordingly, the multi-die package 200 configuration allows for signaling and power to be distributed as needed within the multi-die package 200 and to external devices. However, it will be appreciated that various aspects provided herein are solely for illustration and should not be construed to limit the various aspects disclosed and claimed.

The contact pads 162, contacts 112 and 122, and pads 111 and 121 may be formed from any high conductive material, such as, copper (Cu), aluminum (Al), silver (Ag), gold (Au) or other conductive materials, alloys, or combinations thereof. For example, different types of connectors and/or contacts, materials and configurations may be used, as is known, so long as the configuration provides the functional electrical coupling of the dies internal to the package and to external devices.

In order to fully illustrate aspects of the design of the present disclosure, methods of fabrication are presented. Other methods of fabrication are possible and the discussed fabrication methods are presented only to aid understanding of the concepts disclosed herein.

Figure 3A:
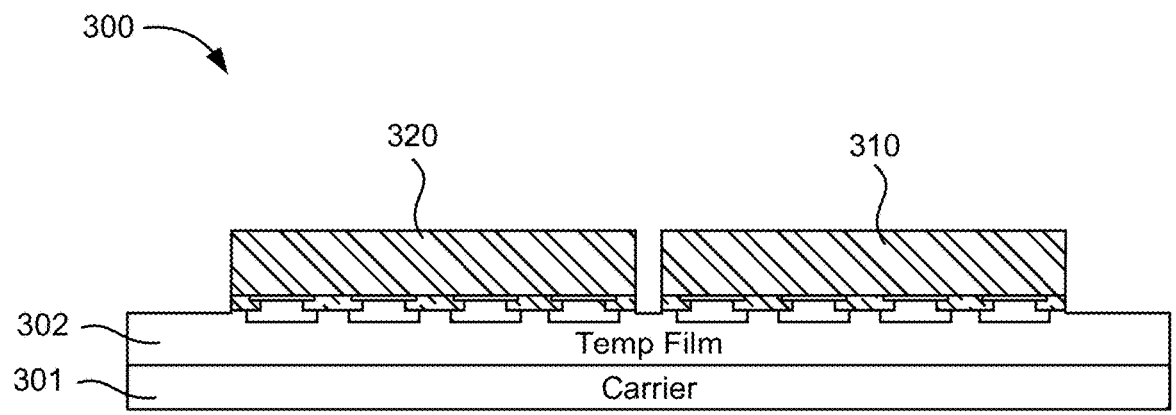
FIGS. 3A-3H illustrate portions of a process of fabricating a multi-die package in accordance with at least one aspect of the disclosure.

FIG. 3A illustrates a portion of a process of fabricating a multi-die package 300, for instance, having a molded multi-die high density interconnect package 300 in accordance with at least one aspect of the disclosure. The process begins with die placement and attachment of the first die 310 and the second die 320 attached to a temporary support film 302 disposed on a carrier 301.

Figure 3B:
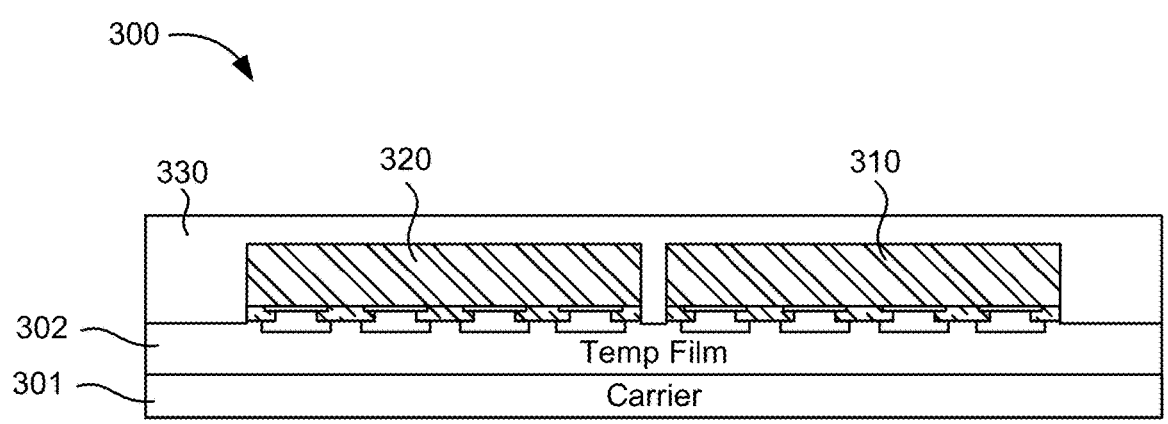

FIG. 3B illustrates a portion of the process of fabricating the multi-die package 300, having a molded multi-die high density interconnect in accordance with at least one aspect of the disclosure. The process continues with the first die 310 and the second die 320 attached to the temporary support film 302 disposed on a carrier 301. In this portion, a molding process is performed to embed the first die 310 and second die 320 in a mold compound 330 to prevent misalignment of the dies during further processing.

Figure 3C:
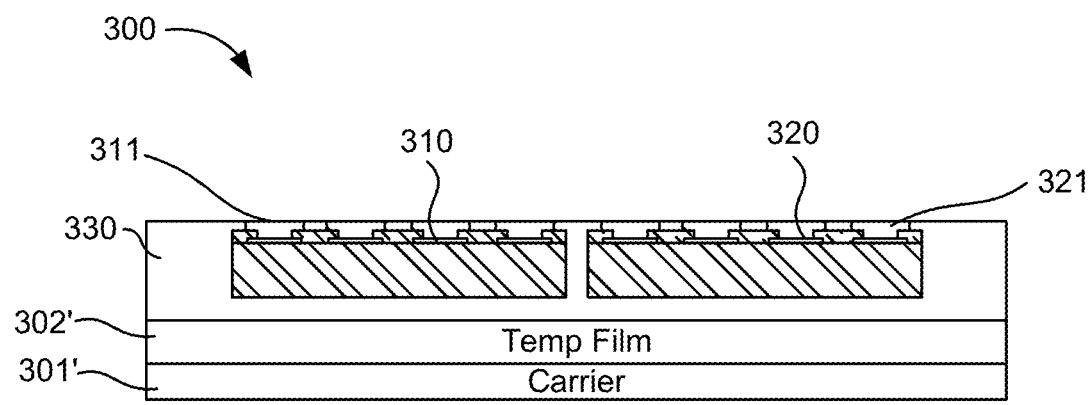

FIG. 3C illustrates a portion of the process of fabricating the multi-die package 300, having a molded multi-die high density interconnect in accordance with at least one aspect of the disclosure. The process continues with the first die 310 and the second die 320 embedded in mold compound 330. In this portion, the first die 310 and the second die 320 are flipped upside-down and attached to a temporary support film 302' disposed on a carrier 301'. This exposes the pads 311 of the first die 310 and pads 321 of the second die 320 for further processing.

Figure 3D:
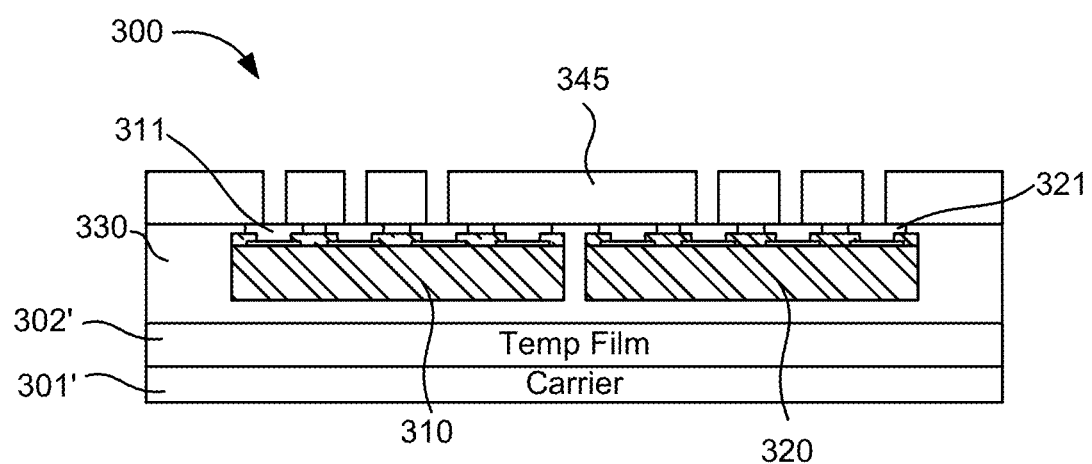

FIG. 3D illustrates a portion of the process of fabricating the multi-die package 300, having a molded multi-die high density interconnect in accordance with at least one aspect of the disclosure. The process continues with the first die 310 and the second die 320 embedded in mold compound 330 flipped upside down and attached to the temporary support film 302' disposed on the carrier 301'. In this portion, a photoresist 345 is deposited over the pads 311 of the first die 310 and pads 321 of the second die 320 and patterned to provide access to the pads 311 of the first die 310 and pads 321 of the second die 320 for further processing.

Figure 3E:
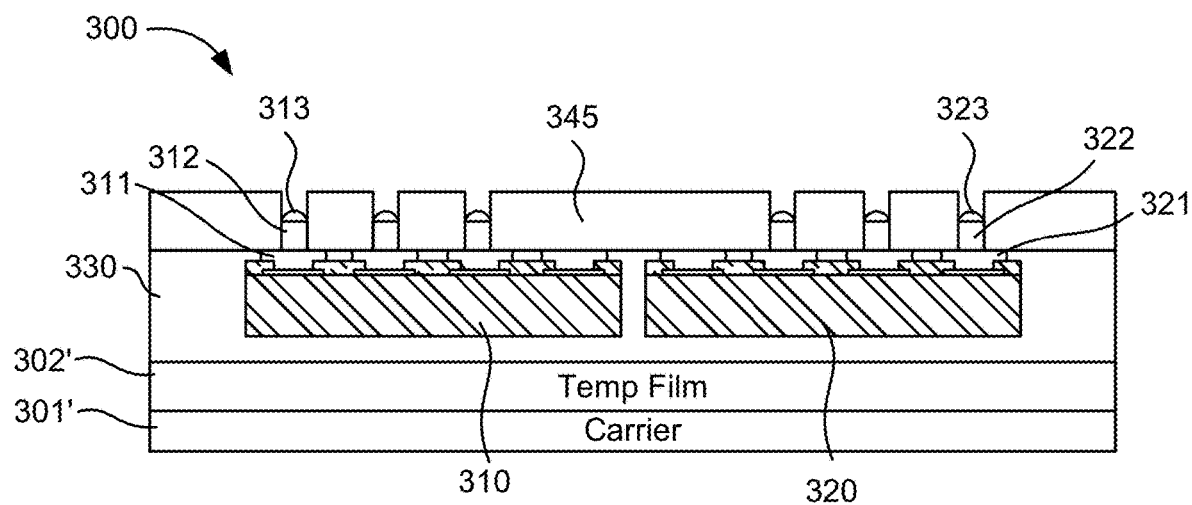

FIG. 3E illustrates a portion of the process of fabricating the multi-die package 300, having a molded multi-die high density interconnect in accordance with at least one aspect of the disclosure. The process continues with the first die 310 and the second die 320 embedded in mold compound 330 flipped upside down and attached to the temporary support film 302' disposed on the carrier 301'. In this portion, a first plurality of contacts 312 of the first die 310 are formed on the pads 311 in openings of the photoresist 345. Also, a first plurality of contacts 322 of the second die 320 are formed on the pads 321 in openings of the photoresist 345. In some aspects, the first plurality of contacts 312 of the first die 310 are copper pillars, which may have solder bumps 313. Likewise, the first plurality of contacts 322 of the second die 320 may also be copper pillars, which may have solder bumps 323. In some aspects, since the first plurality of contacts 312 of the first die 310 are formed through openings of the photoresists 345, this ensures that a second plurality of contacts of the first die 310 (such as, for instance, the pads which of the first die 310 which are not exposed by the photoresist 345) have a smaller height than the first plurality of contacts 312. Likewise, since the first plurality of contacts 322 of the second die 320 are (also) formed through openings of the photoresists 345, this ensures that a second plurality of contacts of the second die 320 (such as, for instance, the pads which of the second die 320 which are not exposed by the photoresist 345) have a smaller height than the first plurality of contacts 312.

Figure 3F:
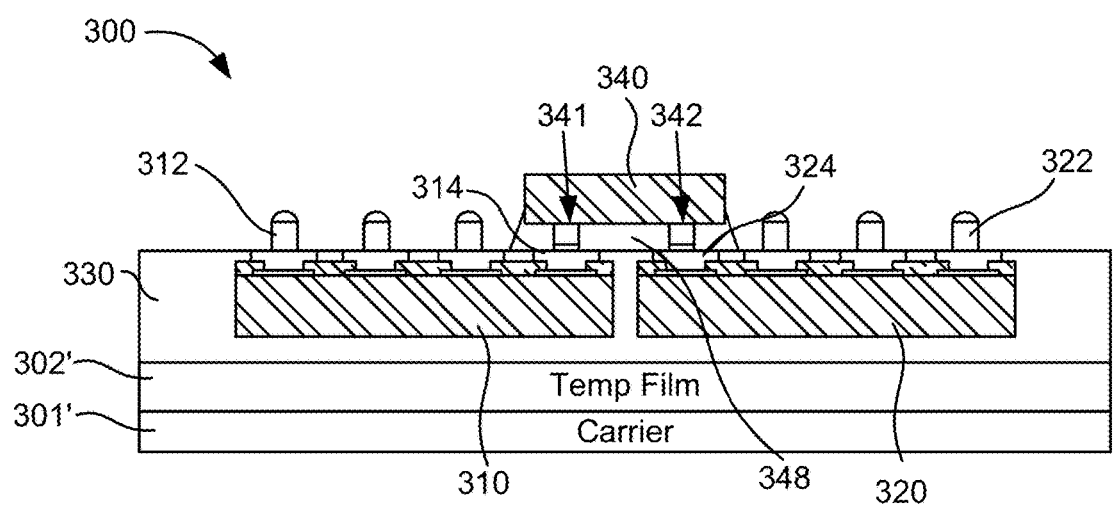

FIG. 3F illustrates a portion of the process of fabricating the multi-die package 300, having a molded multi-die high density interconnect in accordance with at least one aspect of the disclosure. The process continues with the first die 310 and the second die 320 embedded in mold compound 330 flipped upside down and attached to the temporary support film 302' disposed on the carrier 301'. In this portion, the photoresist is removed and the first plurality of contacts 312 of the first die 310 and the first plurality of contacts 322 of the second die 320 are exposed. A bridge die 340 having a first plurality of interconnects 341 and second plurality of interconnects 342 is coupled to the first die 310 and second die 320. In some aspects, the first plurality of interconnects 341 and the second plurality of interconnects 342 may be wire stud bumps, copper pillars, which may have solder bumps, or any suitable bumping/connection configuration. In this configuration, the second plurality of contacts 314 of the first die 310 and the second plurality of contacts 324 of the second die 320 may be pads. The coupling of the interconnects 341 and contacts 314 and interconnects 342 and contacts 324 may be performed by a solder reflow, thermo-compression process, or any other suitable process. However, it will be appreciated the various aspects disclosed herein are not limited to the illustrated configuration. Any suitable electrical coupling technique may be used to couple the first plurality of interconnects 341 to the second plurality of contacts 314 of the first die 310 and the second plurality of interconnects 342 to the second plurality of contacts 324 or the second die 320. Further, a first underfill 348 is applied to embed the electrical couplings and provide additional mechanical stability of the die bridge 340 for further processing. In some aspects, since the first plurality of interconnects 341 of the bridge die 340 is formed using a separate processing step (and further using a different type of coupling technique), this allows for the first plurality of interconnects 341 having a smaller height than the first plurality of contact 312 of the first die 310 (such as, for instance, the copper pillars which may have solder bumps 313). Likewise, since the second plurality of interconnects 342 of the bridge die 340 is (also) formed using a separate processing step (and further using a different type of coupling technique), this allows for the second plurality of interconnects 342 having a smaller height than the first plurality of contact 322 of the second die 320 (such as, for instance, the copper pillars which may have solder bumps 323).

Figure 3G:
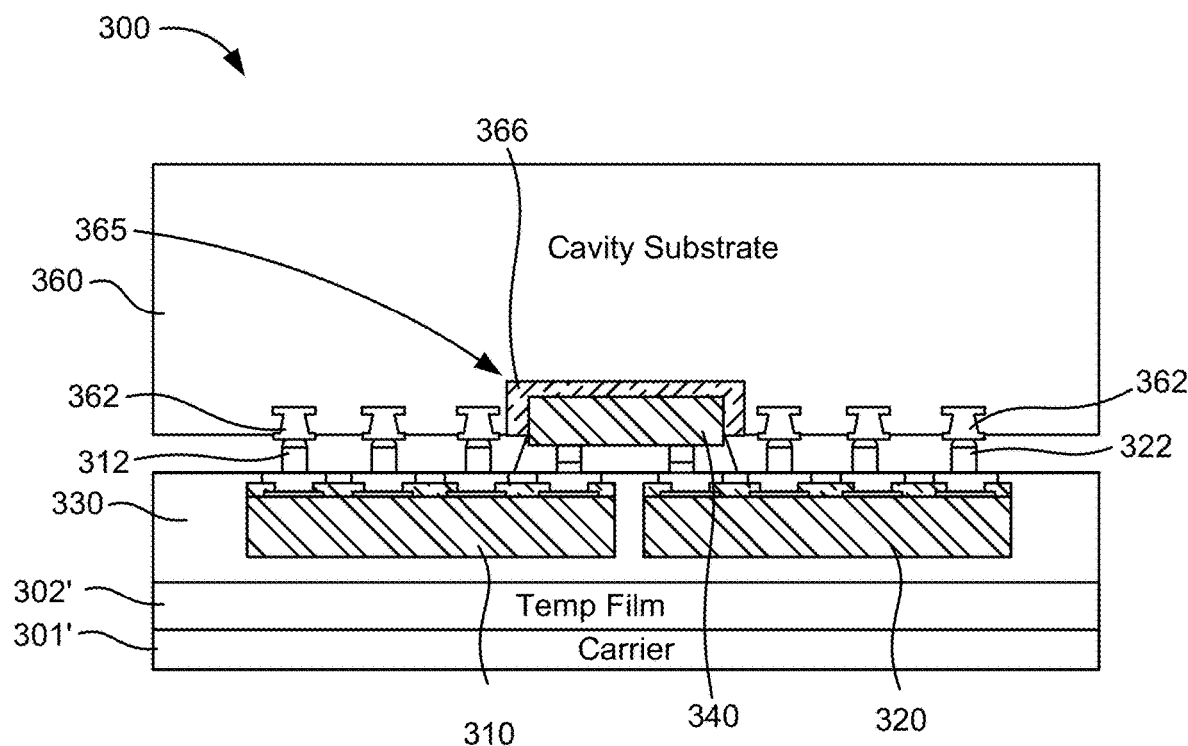

FIG. 3G illustrates a portion of the process of fabricating the multi-die package 300, having a molded multi-die high density interconnect in accordance with at least one aspect of the disclosure. The process continues with the first die 310 and the second die 320 embedded in mold compound 330 flipped upside down and attached to the temporary support film 302' disposed on the carrier 301'. The bridge die 340 is coupled to the first die 310 and second die 320. In this portion, a package substrate 360 having a cavity 365 is provided. The package substrate 360 is coupled to the bridge die 340 using an adhesive 366. The package substrate 360 is also coupled using pads 362 to the first plurality of contacts 312 of the first die 310 and the first plurality of contacts 322 of the second die 320. The coupling of the pads 362 to contacts 312 and 322 may be performed by a solder reflow process or any other suitable process. It will be appreciated the various aspects disclosed herein are not limited to the illustrated configuration. It will be appreciated that the adhesive and the pad coupling discussed in the foregoing are provided merely as examples and other bonding techniques may be used in accordance with the various aspects disclosed.

Figure 3H:
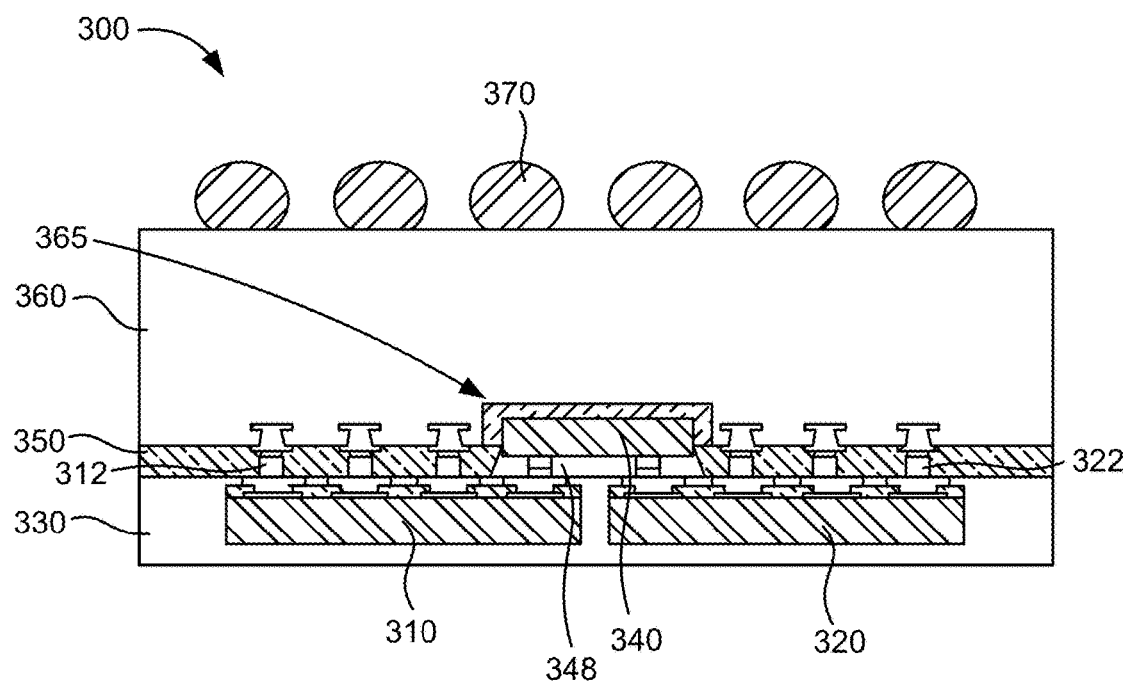

FIG. 3H illustrates a portion of the process of fabricating the multi-die package 300, having a molded multi-die high density interconnect in accordance with at least one aspect of the disclosure. The process continues with the first die 310 and the second die 320 embedded in mold compound 330 flipped upside down. The bridge die 340 is coupled to the first die 310 and second die 320. The package substrate 360 has a cavity 365 in which the bridge die 340 is embedded. The package substrate 360 is coupled to the first plurality of contacts 312 of the first die 310 and the first plurality of contacts 322 of the second die 320. In this portion, an optional second underfill 350 is disposed between the package substrate 360 and the first die 310 and the second die 320 embedded in mold compound 330. In this portion of the process, the optional second underfill 350 embeds the contacts (312 and 322) and bridge die 340 with first underfill 348. A ball attached process can be used to form the external connectors 370 (such as, solder balls, BGA, and the like) that are attached to the package substrate 360 using conventional techniques. However, it will be appreciated that other external connectors 370 can be used and the various aspects are not limited to the illustrated example. Further, the temporary support film 302' and carrier 301' (not illustrated) are removed. It will be appreciated that resulting multi-die package 300 is similar to the multi-die package 200 of FIG. 2, except it is flipped upside down.

Figure 4A:
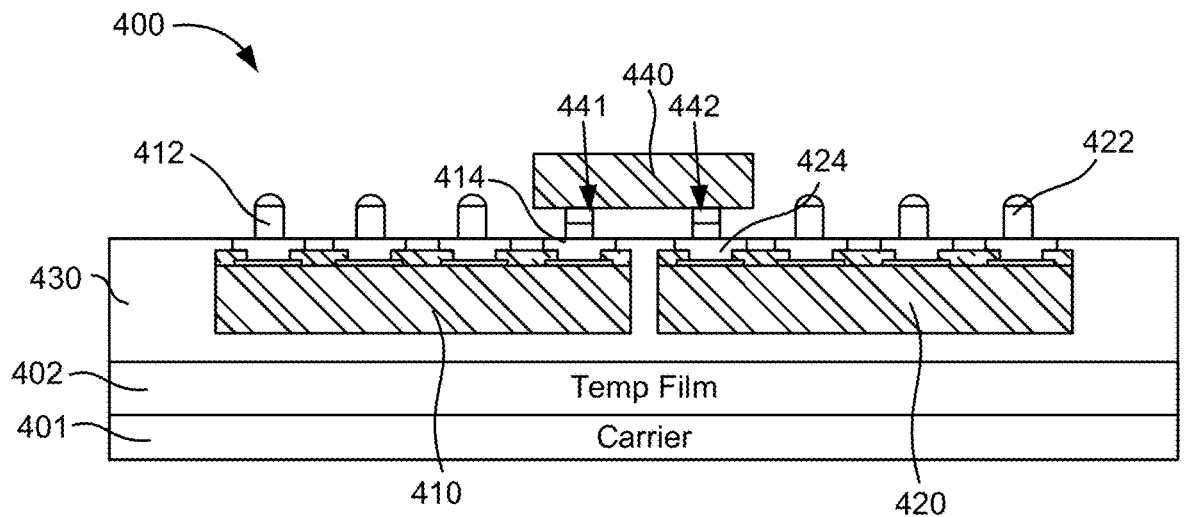
FIGS. 4A-4C illustrate portions of another process of fabricating a multi-die package in accordance with at least one aspect of the disclosure.

FIG. 4A illustrates a portion of another process of fabricating a multi-die package 400, having a molded multi-die high density interconnect in accordance with at least one aspect of the disclosure. The initial fabrication process is similar to those portions detailed above with respect to FIG. 3A to FIG. 3E and therefore a repetition of those processes will not be repeated. Accordingly, the process continues with the first die 410 and the second die 420 embedded in mold compound 430 flipped upside down and attached to the temporary support film 402 disposed on a carrier 401. In this portion, the photoresist (not illustrated) was removed and the first plurality of contacts 412 of the first die 410 and a first plurality of contacts 422 of the second die 420 are exposed. A bridge die 440 having a first plurality of interconnects 441 is coupled to the first die 410 and second plurality of interconnects 442 of bridge die 440 is coupled to the second die 420. In some aspects, the first plurality of interconnects 441 and the second plurality of interconnects 442 may be wire stud bumps, copper pillars, which may have solder bumps, or any suitable bumping/connection configuration. In this configuration, the second plurality of contacts 414 of the first die 410 and the second plurality of contacts 424 of the second die may be pads to allow for coupling to the interconnects 441 and 442. The coupling of the interconnects 441 and contacts 414 and interconnects 442 and contacts 424 may be performed by a solder reflow, thermo-compression process or any other suitable process. However, it will be appreciated the various aspects disclosed herein are not limited to the illustrated configuration. It will be appreciated in this configuration no underfill is applied. In some aspects, since the first plurality of interconnects 441 of the bridge die 440 is formed using a separate processing step (and further using a different type of coupling technique), this enables that the first plurality of interconnects 441 has a smaller height than the first plurality of contact 412 of the first die 410 (such as, for instance, copper pillars which may have solder bumps). Likewise, since the second plurality of interconnects 442 of the bridge die 440 is (also) formed using a separate processing step (and further using a different type of coupling technique), this felicitates that the second plurality of contacts 442 has a smaller height than the first plurality of contact 422 of the second die 420 (such as, for instance, copper pillars which may have solder bumps).

Figure 4B:
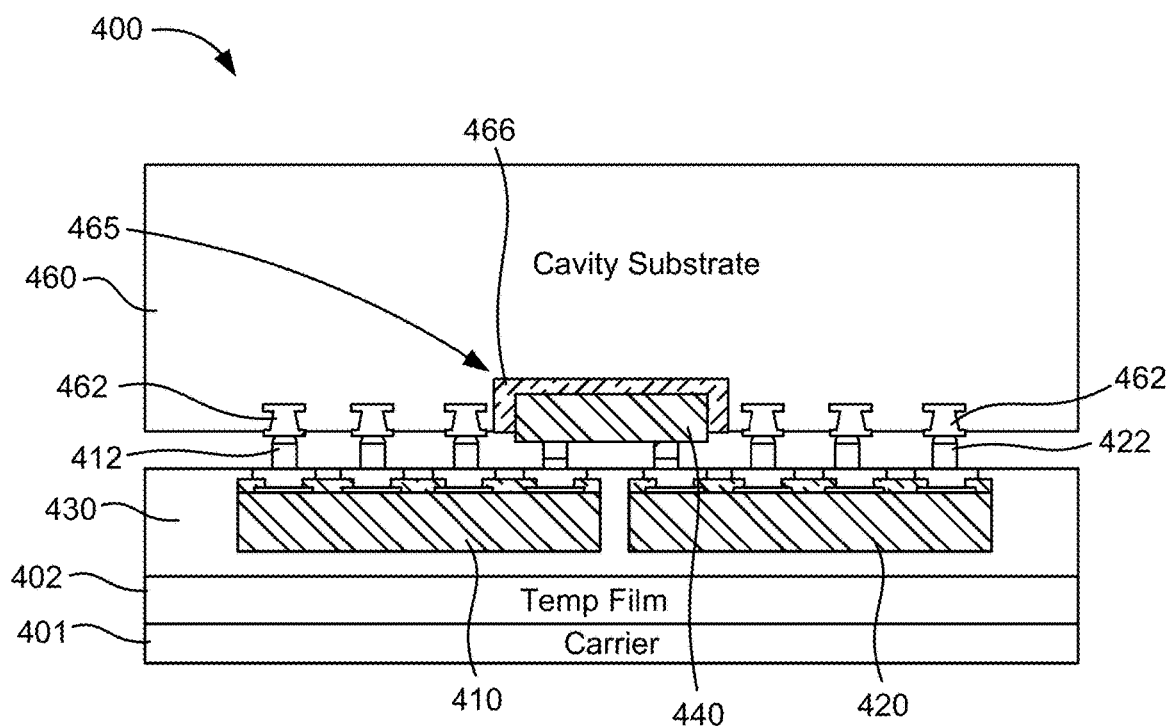

FIG. 4B illustrates a portion of the process of fabricating the multi-die package 400 having a molded multi-die high density interconnect in accordance with at least one aspect of the disclosure. The process continues with the first die 410 and the second die 420 embedded in mold compound 430 flipped upside down and attached to the temporary support film 402 disposed on the carrier 401. The bridge die 440 is coupled to the first die 410 and second die 420. In this portion, a package substrate 460 having a cavity 465 is provided. The package substrate 460 is coupled to the bridge die 440 using an adhesive 466. The package substrate 460 is also coupled, using pads 462, to the first plurality of contacts 412 of the first die 410 and the first plurality of contacts 422 of the second die 420. The coupling of the pads 462 to contacts 412 and 422 may be performed by a solder reflow process or any other suitable process. Accordingly, it will be appreciated the various aspects disclosed herein are not limited to the illustrated configurations. It will be appreciated that the adhesive and the pad coupling discussed in the foregoing are provided merely as examples and other bonding techniques may be used in accordance with the various aspects disclosed.

Figure 4C:
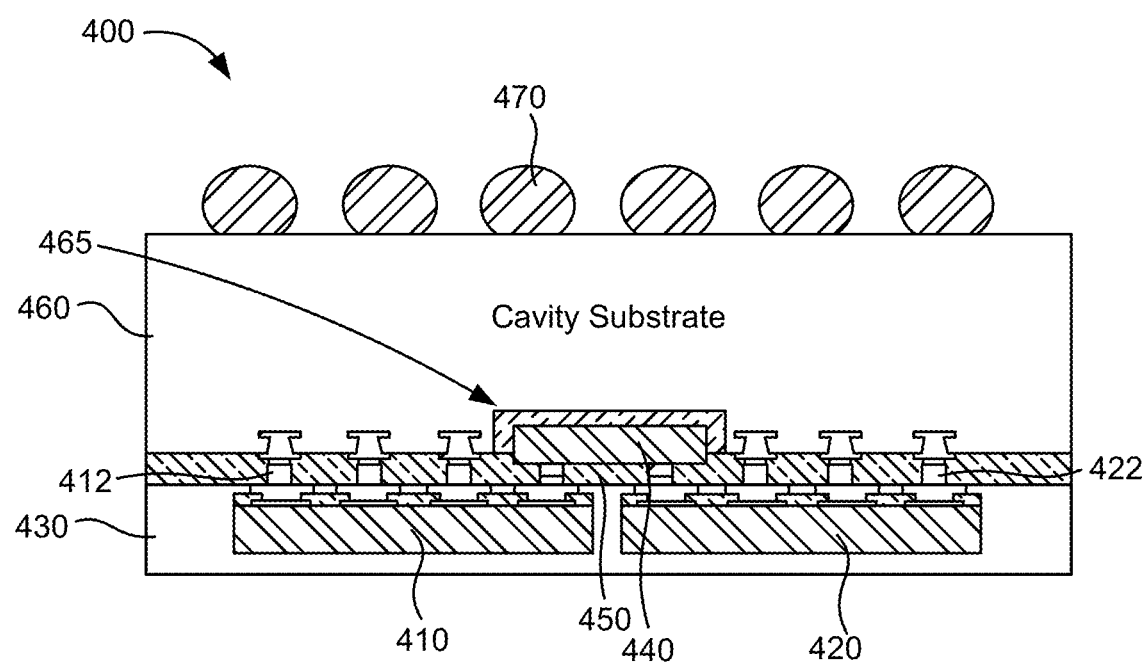

FIG. 4C illustrates a portion of the process of fabricating the multi-die package 400 having a molded multi-die high density interconnect in accordance with at least one aspect of the disclosure. The process continues with the first die 410 and the second die 420 embedded in mold compound 430 flipped upside down. The bridge die 440 is coupled to the first die 410 and second die 420. The package substrate 460 has a cavity 465 in which the bridge die 440 is embedded. The package substrate 460 is coupled to the first plurality of contacts 412 of the first die 410 and the first plurality of contacts 422 of the second die 420. In this portion, an underfill 450 is disposed between the package substrate 460 and the first die 410 and the second die 420 embedded in mold compound 430. The underfill 450 also embeds the contacts (412 and 422) and bridge die 440. The solder balls of the BGA 470 are attached to the package substrate on the outside of the multi-die package 400 using conventional techniques. Further, the temporary support film 402 and carrier 401 are removed. It will be appreciated that resulting multi-die package 400 is similar to the multi-die package 200 of FIG. 2, except there is no separate underfill applied to bridge die 440 and the package is flipped upside down.

It will be appreciated that the foregoing fabrication process was provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 5:
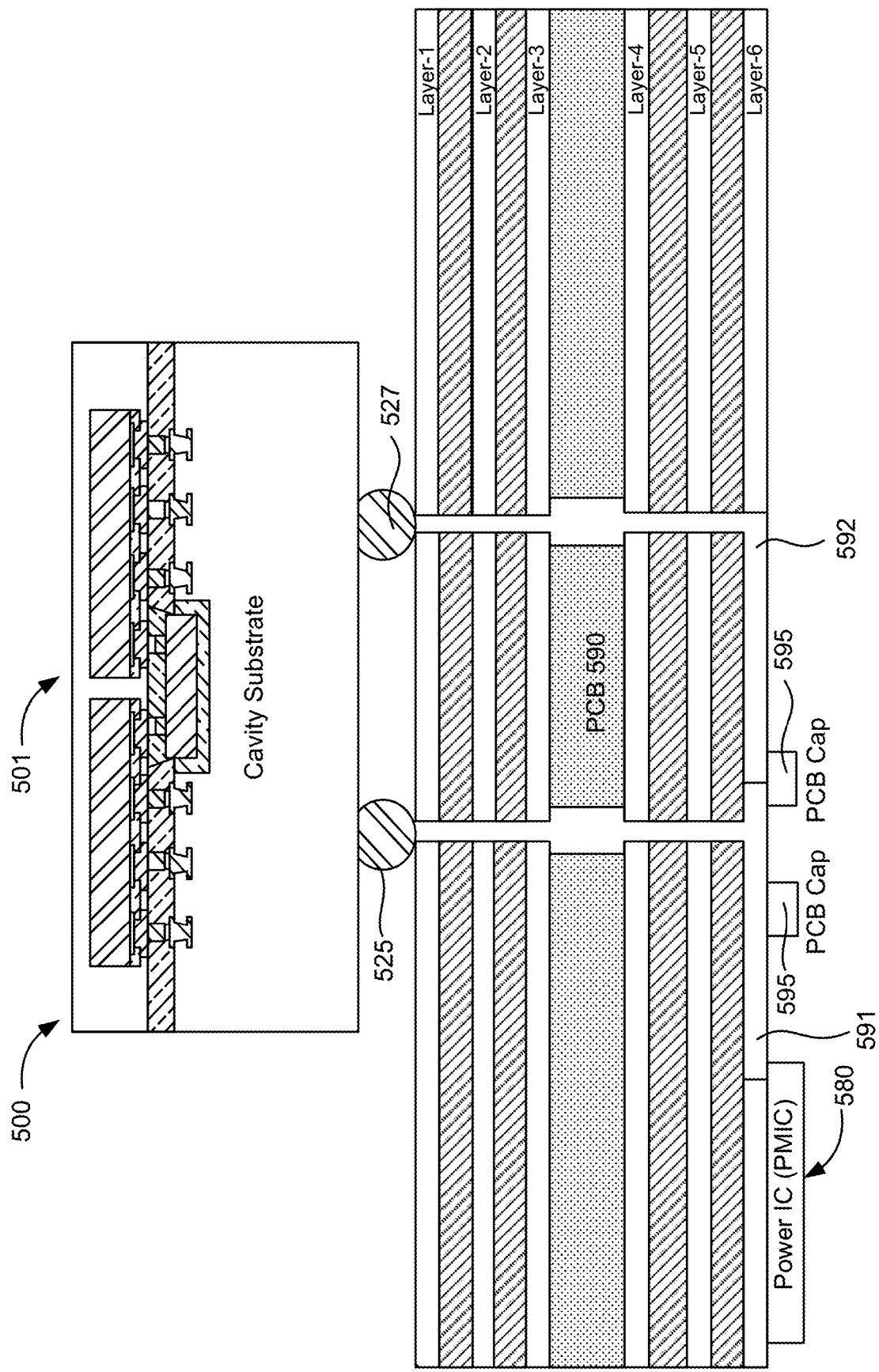
FIG. 5 illustrates components of an integrated device in accordance with one or more aspects of the disclosure.
Figure 6:
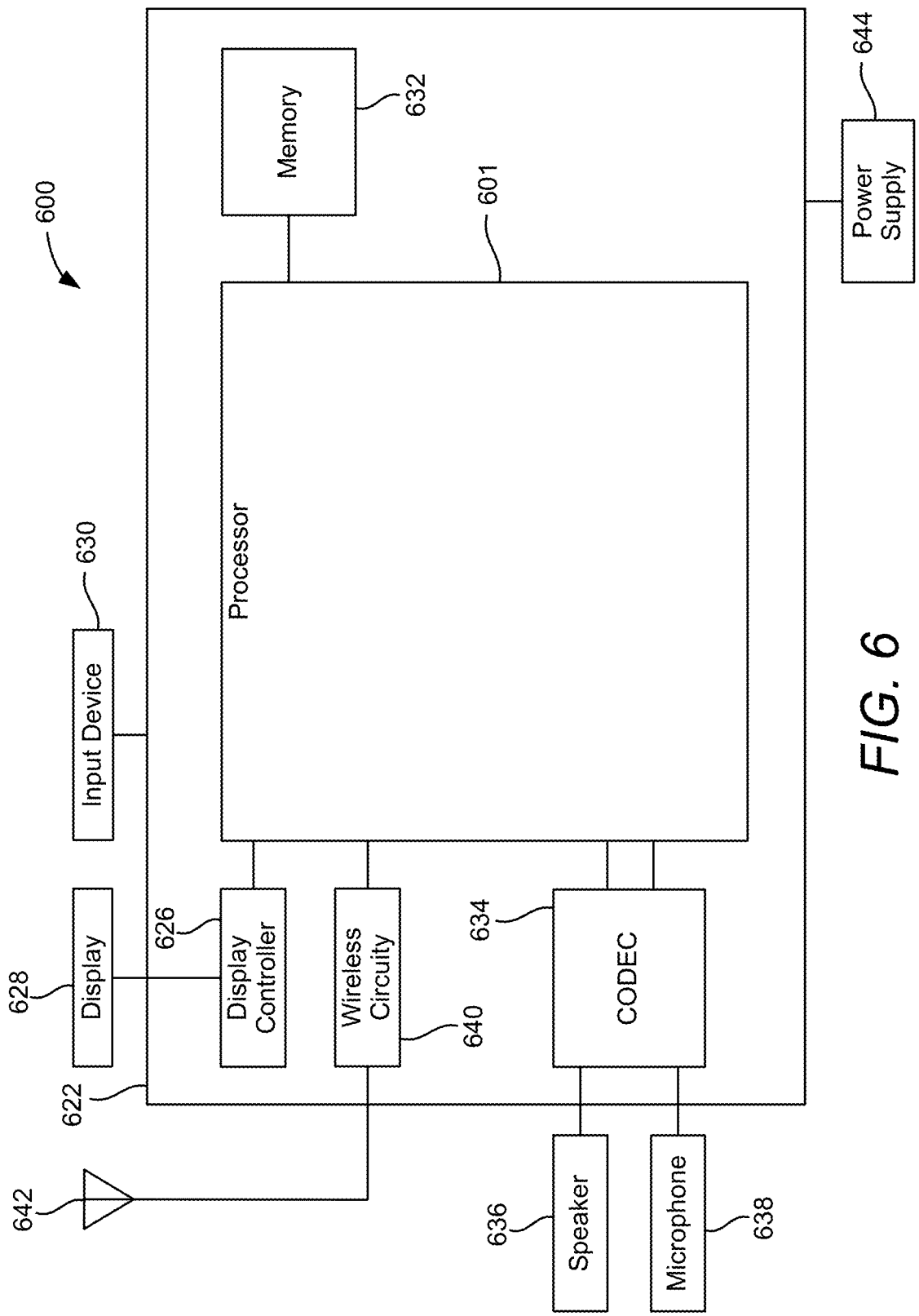
FIG. 6 illustrates an exemplary mobile device in accordance with one or more aspects of the disclosure.

FIG. 5 illustrates components of an integrated device 500 according to one or more aspects of the disclosure. Regardless of the various configurations of the packages (e.g., packages 200, 300 and 400) discussed above, it will be appreciated that the package 501 has similar features and accordingly the details will not be provided here. The package 501 may be configured to couple to a PCB 590. The PCB 590 is also coupled to a power supply 580 (e.g., a power management integrated circuit (PMIC)), which allows the package 501 to be electrically coupled to the PMIC 580. Specifically, one or more power supply (VDD) lines 591 and one or more ground (GND) lines 592 may be coupled to the PMIC 580 to distribute power to the PCB 590, package 501 via VDD BGA pin 525 and GND BGA pin 527. The VDD line 591 and GND line 592 each may be formed from traces, shapes, or patterns in one or more metal layers of the PCB 590 (e.g., layers 1-6) coupled by one or more vias through insulating layers separating the metal layers 1-6 in the PCB 590. The PCB 590 may have one or more PCB capacitors (PCB cap) 595 that can be used to condition the power supply signals, as is known to those skilled in the art. Additional connections and devices may be coupled to and/or pass through the PCB 590 to the package 501 via one or more additional BGA pins on the package 501. It will be appreciated that the illustrated configuration and descriptions are provided merely to aid in the explanation of the various aspects disclosed herein. For example, the PCB 590 may have more or less metal and insulating layers, there may be multiple lines providing power to the various components, etc. Accordingly, the forgoing illustrative examples and associated figures should not be construed to limit the various aspects disclosed and claimed herein FIG. 6 illustrates an exemplary mobile device in accordance with some examples of the disclosure. Referring now to FIG. 6, a block diagram of a mobile device that is configured according to exemplary aspects is depicted and generally designated mobile device 600. In some aspects, mobile device 600 may be configured as a wireless communication device. As shown, mobile device 600 includes processor 601. Processor 601 may be communicatively coupled to memory 632 over a link, which may be a die-to-die or chip-to-chip link. Mobile device 600 also includes display 628 and display controller 626, with display controller 626 coupled to processor 601 and to display 628.

In some aspects, FIG. 6 may include coder/decoder (CODEC) 634 (e.g., an audio and/or voice CODEC) coupled to processor 601; speaker 636 and microphone 638 coupled to CODEC 634; and wireless circuits 640 (which may include a modem, RF circuitry, filters, etc.) coupled to wireless antenna 642 and to processor 601.

In a particular aspect, where one or more of the above-mentioned blocks are present, processor 601, display controller 626, memory 632, CODEC 634, and wireless circuits 640 can be included in a system-in-package or system-on-chip device 622 which may be implemented in whole or part using the molded multi-die high density interconnect package (e.g., 200, 300, 400) and techniques disclosed herein. Input device 630 (e.g., physical, or virtual keyboard), power supply 644 (e.g., battery), display 628, input device 630, speaker 636, microphone 638, wireless antenna 642, and power supply 644 may be external to system-on-chip device 622 and may be coupled to a component of system-on-chip device 622, such as an interface or a controller.

It should be noted that although FIG. 6 depicts a mobile device 600, processor 601 and memory 632 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
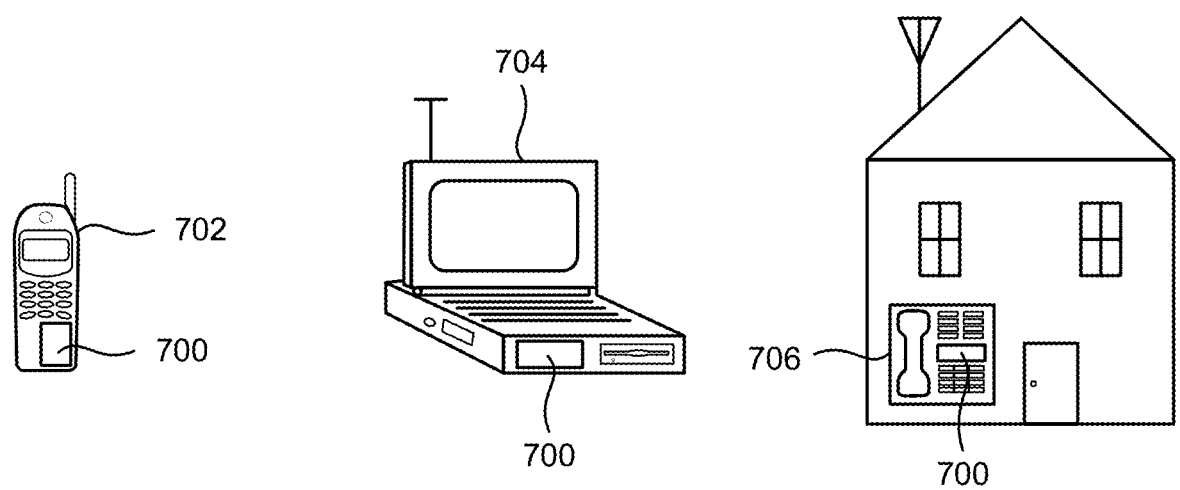
FIG. 7 illustrates various electronic devices that may be integrated with any of the aforementioned devices in accordance with one or more aspects of the disclosure.

FIG. 7 illustrates various electronic devices that may be integrated with any of the aforementioned integrated device, package, or semiconductor device in accordance with various examples of the disclosure. For example, a mobile phone device 702, a laptop computer device 704, and a fixed location terminal device 706 may each be considered generally user equipment (UE) and may include a multi-die package 700 as described herein, which may be similar to molded multi-die packages 200, 300 and 400 described herein. The devices 702, 704, 706 illustrated in FIG. 7 are merely exemplary. Other electronic devices may also feature the molded multi-die high density interconnect device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into semiconductor packages, integrated devices, system-on-chip devices, and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

In accordance with the various aspects disclosed herein, at least one aspect includes an apparatus comprising a molded multi-die high density interconnect (e.g., 100, 200, 300, 400 and 501) including: a bridge die (e.g., 140, 340, 440) having a first plurality of interconnects (e.g., 141, 341, 441) and second plurality of interconnects (e.g., 142, 342, 442); a first die (e.g., 110, 310, 410) having a first plurality of contacts (e.g., 112, 312, 412) and a second plurality of contacts (e.g., 114, 314, 414). The second plurality of contacts is coupled to the first plurality of interconnects of the bridge die. The coupled second plurality of contacts and first plurality of interconnects have a smaller height than the first plurality of contacts of the first die. A second die (e.g., 120, 320, 420) having a first plurality of contacts (e.g., 122, 322, 422) and a second plurality of contacts (e.g., 124, 324, 424). The second plurality of contacts is coupled to the second plurality of interconnects of the bridge die. The coupled second plurality of contacts and second plurality of interconnects have a smaller height than the first plurality of contacts of the second die.

Among the various technical advantages, the various aspects disclosed provide, in at least some aspects, the direct coupling of the bridge die to the first die and the second die allows for a reduced height of the connections between the bridge die and the first die and second die. Additionally, the precise placement of the bridge die, the first die and second die allow for a finer pitch of connections. Further, having the bridge die (e.g., 140, 340, 440) embedded in a cavity in the substrate allows for additional package height reduction. Other technical advantages will be recognized from various aspects disclosed herein and these technical advantages are merely provided as examples and should not be construed to limit any of the various aspects disclosed herein.

Figure 8:
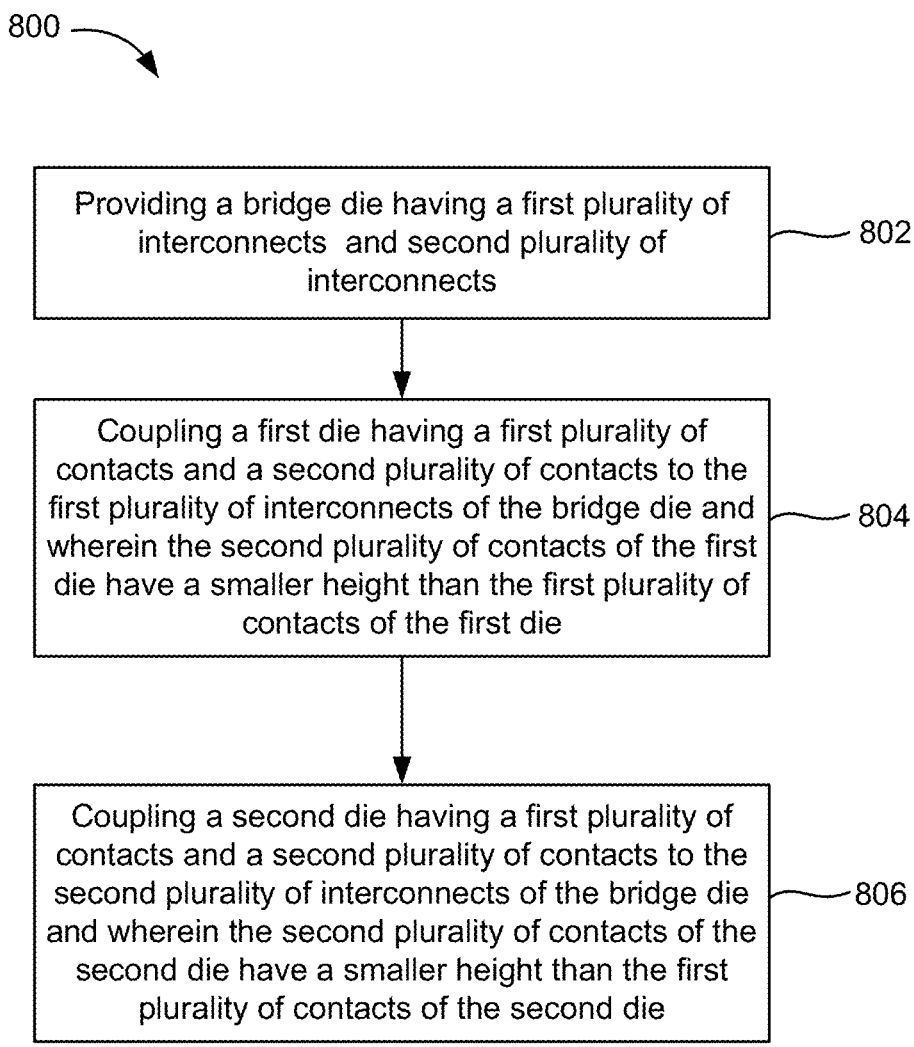
FIG. 8 illustrates a flowchart of a method for manufacturing a device in accordance with one or more aspects of the disclosure.

It will be appreciated from the foregoing that there are various methods for fabricating multi-die packages disclosed herein. FIG. 8 illustrates a flowchart of a method 800 for fabricating an apparatus having a molded multi-die high density interconnect package. The method includes, in block 802, providing a bridge die (e.g., 140) having a first plurality of interconnects (e.g., 141) and second plurality of interconnects (e.g., 142). In block 804, the process continues with coupling a first die (e.g., 110) having a first plurality of contacts (e.g., 112) and a second plurality of contacts (e.g., 114) to the first plurality of interconnects of the bridge die, where the coupled second plurality of contacts and first plurality of interconnects have a smaller height than the first plurality of contacts of the first die. In block 806, the process continues with coupling a second die (e.g., 120) having a first plurality of contacts (e.g., 122) and a second plurality of contacts (e.g., 124) to the second plurality of interconnects of the bridge die, where the coupled second plurality of contacts and second plurality of interconnects have a smaller height than the first plurality of contacts of the second die.

Accordingly, it will be appreciated from the foregoing disclosure that additional processes for fabricating the various aspects disclosed herein will be apparent to those skilled in the art and a literal rendition of the processes discussed above will not be provided or illustrated in the included drawings.

One or more of the components, processes, features, and/or functions illustrated in FIGS. 1-8 may be rearranged and/or combined into a single component, process, feature, or function or incorporated in several components, processes, or functions. Additional elements, components, processes, and/or functions may also be added without departing from the disclosure. It should also be noted that FIGS. 1-8 and corresponding description in the present disclosure are not limited to dies and/or ICs. In some implementations, FIGS. 1-8 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, or a package on package (PoP) device.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus comprising a multi-die interconnect comprising: a bridge die having a first plurality of interconnects and a second plurality of interconnects; a first die having a first plurality of contacts and a second plurality of contacts, wherein the second plurality of contacts of the first die is coupled to the first plurality of interconnects of the bridge die and wherein the second plurality of contacts of the first die both have a smaller height than the first plurality of contacts of the first die; and a second die having a first plurality of contacts and a second plurality of contacts, wherein the second plurality of contacts of the second die is coupled to the second plurality of interconnects of the bridge die and wherein the second plurality of contacts of the second die both have a smaller height than the first plurality of contacts of the second die.

Clause 2. The apparatus of clause 1, wherein the first die and second die are embedded in a mold compound.

Clause 3. The apparatus of any of clauses 1 to 2, wherein the first plurality of interconnects and second plurality of interconnects of the bridge die have a smaller pitch than the first plurality of contacts of the first die and the first plurality of contacts of the second die.

Clause 4. The apparatus of clause 3, wherein the first plurality of interconnects and second plurality of interconnects of the bridge die are configured as die bumps with a pitch in a range of 40 µm to 55 µm.

Clause 5. The apparatus of clause 4, wherein the second plurality of contacts of the first die are pads and the second plurality of contacts of the second die are pads.

Clause 6. The apparatus of any of clauses 1 to 5, wherein the first plurality of interconnects and second plurality of interconnects of the bridge die are embedded in a first underfill.

Clause 7. The apparatus of any of clauses 1 to 6, further comprising: a package substrate having a cavity and a plurality of pads, wherein the bridge die is disposed at least partially in the cavity, and wherein the plurality of pads is coupled to the first plurality of contacts of the first die and the first plurality of contacts of the second die.

Clause 8. The apparatus of clause 7, further comprising: a second underfill, wherein the first plurality of contacts of the first die and the first plurality of contacts of the second die are embedded in the second underfill.

Clause 9. The apparatus of any of clauses 7 to 8, further comprising: a plurality of connectors external to the package substrate, wherein a least one of the plurality of pads is.

Clause 10. The apparatus of any of clauses 1 to 9, wherein a combined height of the first plurality of interconnects of the bridge die and the second plurality of contacts of the first die is smaller than a height the first plurality of contacts of the first die.

Clause 11. The apparatus of any of clauses 1 to 10, wherein a combined height of the second plurality of interconnects of the bridge die and the second plurality of contacts of the second die is smaller than a height of the first plurality of contacts of the second die.

Clause 12. The apparatus of any of clauses 1 to 11, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station, and a device in an automotive vehicle.

Clause 13. A method for fabricating an apparatus having a multi-die interconnect, the method comprising: providing a bridge die having a first plurality of interconnects and second plurality of interconnects; providing a bridge die having a first plurality of interconnects and a second plurality of interconnects; coupling a first die having a first plurality of contacts and a second plurality of contacts to the first plurality of interconnects of the bridge die using the second plurality of contacts of the first die, wherein the second plurality of contacts of the first die and first plurality of interconnects have both a smaller height than the first plurality of contacts of the first die; and coupling a second die having a first plurality of contacts and a second plurality of contacts to the second plurality of interconnects of the bridge die using the second plurality of contacts of the second die, wherein the second plurality of contacts of the second die and the second plurality of interconnects have both a smaller height than the first plurality of contacts of the second die.

Clause 14. The method of clause 13, further comprising: embedding the first die and second die in a mold compound.

Clause 15. The method of any of clauses 13 to 14, wherein the first plurality of interconnects and second plurality of interconnects of the bridge die have a smaller pitch than the first plurality of contacts of the first die and the first plurality of contacts of the second die.

Clause 16. The method of clause 15, wherein the first plurality of interconnects and second plurality of interconnects of the bridge die are configured as die bumps with a pitch in a range of 40 µm to 55 µm.

Clause 17. The method of clause 16, wherein the second plurality of contacts of the first die are pads and the second plurality of contacts of the second die are pads.

Clause 18. The method of any of clauses 13 to 17, further comprising: embedding the first plurality of interconnects and second plurality of interconnects of the bridge die in a first underfill.

Clause 19. The method of any of clauses 13 to 18, further comprising: providing a package substrate having a cavity and a plurality of pads, embedding the bridge die at least partially in the cavity, and coupling the plurality of pads to the first plurality of contacts of the first die and the first plurality of contacts of the second die.

Clause 20. The method of clause 19, further comprising: embedding, in a second underfill, the first plurality of contacts of the first die and the first plurality of contacts of the second die.

Clause 21. The method of any of clauses 19 to 20, further comprising: forming a plurality of connectors on an opposite side of the package substrate to the plurality of pads.

Clause 22. The method of any of clauses 13 to 21, wherein the first plurality of interconnects of the bridge die has a smaller height than the first plurality of contacts of the first die.

Clause 23. The method of any of clauses 13 to 22, wherein the coupled second plurality of contacts of the first die and first plurality of interconnects of the bridge die have a smaller height than the first plurality of contacts of the first die, and the coupled second plurality of contacts of the second die and the second plurality of interconnects the bridge die have a smaller height than the first plurality of contacts of the second die.

Clause 24. The method of any of clauses 13 to 23, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station, and a device in an automotive vehicle.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising a multi-die interconnect comprising:
   a bridge die having a first plurality of interconnects and a second plurality of interconnects;
   a first die having a first plurality of contacts and a second plurality of contacts, wherein the second plurality of contacts of the first die is coupled to the first plurality of interconnects of the bridge die and wherein the second plurality of contacts of the first die both have a smaller height than the first plurality of contacts of the first die;
   a second die having a first plurality of contacts and a second plurality of contacts, wherein the second plurality of contacts of the second die is coupled to the second plurality of interconnects of the bridge die and wherein the second plurality of contacts of the second die both have a smaller height than the first plurality of contacts of the second die;
   a first underfill, wherein the first plurality of interconnects and the second plurality of interconnects of the bridge die are embedded in the first underfill; and
   a second underfill, wherein the first plurality of contacts of the first die and the first plurality of contacts of the second die are embedded in the second underfill.

2. The apparatus of claim 1, wherein the first die and second die are embedded in a mold compound.

3. The apparatus of claim 1, wherein the first plurality of interconnects and second plurality of interconnects of the bridge die have a smaller pitch than the first plurality of contacts of the first die and the first plurality of contacts of the second die.

4. The apparatus of claim 3, wherein the first plurality of interconnects and second plurality of interconnects of the bridge die are configured as die bumps with a pitch in a range of 40 μm to 55 μm.

5. The apparatus of claim 4, wherein the second plurality of contacts of the first die are pads and the second plurality of contacts of the second die are pads.

6. The apparatus of claim 1, further comprising:
   a package substrate having a cavity and a plurality of pads,
   wherein the bridge die is disposed at least partially in the cavity, and
   wherein the plurality of pads is coupled to the first plurality of contacts of the first die and the first plurality of contacts of the second die.

7. The apparatus of claim 6, further comprising:
   a plurality of connectors external to the package substrate, wherein a least one of the plurality of pads is.

8. The apparatus of claim 1, wherein a combined height of the first plurality of interconnects of the bridge die and the second plurality of contacts of the first die is smaller than a height the first plurality of contacts of the first die.

9. The apparatus of claim 1, wherein a combined height of the second plurality of interconnects of the bridge die and the second plurality of contacts of the second die is smaller than a height of the first plurality of contacts of the second die.

10. The apparatus of claim 1, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station, and a device in an automotive vehicle.

11. The apparatus of claim 1, wherein a back side of the bridge die opposite the first plurality of interconnects and the second plurality of interconnects has no interconnects.

12. The apparatus of claim 11, further comprising:
   a package substrate having a cavity, wherein the bridge die is disposed at least partially in the cavity and is attached to the cavity by an adhesive on the back side of the bridge die.

13. A method for fabricating an apparatus having a multi-die interconnect, the method comprising:
   providing a bridge die having a first plurality of interconnects and a second plurality of interconnects;
   coupling a first die having a first plurality of contacts and a second plurality of contacts to the first plurality of interconnects of the bridge die using the second plurality of contacts of the first die, wherein the second plurality of contacts of the first die and first plurality of interconnects have both a smaller height than the first plurality of contacts of the first die;

coupling a second die having a first plurality of contacts and a second plurality of contacts to the second plurality of interconnects of the bridge die using the second plurality of contacts of the second die, wherein the second plurality of contacts of the second die and the second plurality of interconnects have both a smaller height than the first plurality of contacts of the second die;

embedding the first plurality of interconnects and the second plurality of interconnects of the bridge die in a first underfill; and embedding the first plurality of contacts of the first die and the first plurality of contacts of the second die in a second underfill.

14. The method of claim 13, further comprising:
embedding the first die and second die in a mold compound.

15. The method of claim 13, wherein the first plurality of interconnects and second plurality of interconnects of the bridge die have a smaller pitch than the first plurality of contacts of the first die and the first plurality of contacts of the second die.

16. The method of claim 15, wherein the first plurality of interconnects and second plurality of interconnects of the bridge die are configured as die bumps with a pitch in a range of 40 μm to 55 μm.

17. The method of claim 16, wherein the second plurality of contacts of the first die are pads and the second plurality of contacts of the second die are pads.

18. The method of claim 13, further comprising:
providing a package substrate having a cavity and a plurality of pads,
embedding the bridge die at least partially in the cavity, and
coupling the plurality of pads to the first plurality of contacts of the first die and the first plurality of contacts of the second die.

19. The method of claim 18, further comprising:
forming a plurality of connectors on an opposite side of the package substrate to the plurality of pads.

20. The method of claim 13, wherein the first plurality of interconnects of the bridge die has a smaller height than the first plurality of contacts of the first die.

21. The method of claim 13, wherein the coupled second plurality of contacts of the first die and first plurality of interconnects of the bridge die have a smaller height than the first plurality of contacts of the first die, and the coupled second plurality of contacts of the second die and the second plurality of interconnects the bridge die have a smaller height than the first plurality of contacts of the second die.

22. The method of claim 13, wherein the apparatus is selected from the group consisting of a music player, a video player, an entertainment unit, a navigation device, a communications device, a mobile device, a mobile phone, a smartphone, a personal digital assistant, an access point, a fixed location terminal, a tablet computer, a computer, a wearable device, an Internet of things (IoT) device, a laptop computer, a server, a base station, and a device in an automotive vehicle.

23. The method of claim 13, wherein a back side of the bridge die opposite the first plurality of interconnects and the second plurality of interconnects has no interconnects.

24. The method of claim 23, further comprising:
attaching, using an adhesive, the back side of the bridge die to a cavity in a package substrate, wherein the bridge die is disposed at least partially in the cavity.

* * * * *